(12) United States Patent
Lin et al.

(10) Patent No.: US 6,864,554 B2
(45) Date of Patent: Mar. 8, 2005

(54) OPTOELECTRONIC DEVICE WITH REFLECTIVE SURFACE

(75) Inventors: Ming-Der Lin, Hsinchu (TW); Kwang-Ru Wang, Chia Yi (TW)

(73) Assignee: Highlink Technology Corporation, Hsinchu (TW)

( * ) Notice: Subject to any disclaimer, the term of this patent is extended or adjusted under 35 U.S.C. 154(b) by 101 days.

(21) Appl. No.: 10/336,791

(22) Filed: Jan. 6, 2003

(65) Prior Publication Data

US 2004/0069999 A1 Apr. 15, 2004

(30) Foreign Application Priority Data

Oct. 11, 2002 (TW) ...................................... 91123522 A

(51) Int. Cl.⁷ ......................................... H01L 31/0203
(52) U.S. Cl. ........................... 257/434; 257/98; 257/99; 257/433
(58) Field of Search ............................ 257/98, 99, 433, 257/434

(56) References Cited

U.S. PATENT DOCUMENTS 5,367,441 A * 11/1994 Wustlich ..................... 362/97
6,459,130 B1 * 10/2002 Arndt et al. .................. 257/98
6,641,287 B2 * 11/2003 Suehiro ....................... 257/98

* cited by examiner

Primary Examiner—Gene M. Munson
(74) Attorney, Agent, or Firm—Sughrue Mion, PLLC

(57) ABSTRACT

An optoelectronic device is disclosed. The optoelectronic device comprises a transparent conductive substrate, an optoelectronic element, and a base. The transparent conductive substrate comprises a transparent plate, a transparent electrode film formed on the transparent plate, and an insulating part formed on the transparent plate. The insulating part divides the transparent electrode film into a first transparent electrode film and a second transparent electrode film that non-conduct each other. The optoelectronic element comprising a positive electrode and a negative electrode is disposed on the transparent conductive substrate and electrically connected to the first transparent electrode film and the second transparent electrode film individually. The base is formed with an opening that has a reflective surface on the bottom of the opening, and the optoelectronic element is held in the opening in a manner of suspending from or connecting with the bottom of the opening.

51 Claims, 6 Drawing Sheets

OPTOELECTRONIC DEVICE WITH REFLECTIVE SURFACE

FIELD OF THE INVENTION

The present invention relates to an optoelectronic device, and more particularly, to an optoelectronic device that can promote light emission intensity and increasing light reception intensity.

BACKGROUND OF THE INVENTION

Currently, one of the most commonly-used optoelectronic elements is a diode, which can be roughly divided into a light-emitting element, such as a light-emitting diode (LED) and a laser diode (LD), and a photosensitive element, such as a photo-detector or a solar cell, wherein the photo-detector can be a photodiode (PD) or a positive-intrinsic-negative (PIN) diode, etc.

The LED is an element having excellent optoelectronic features of low power consumption, low heat generation, long operation life, good impact resistance, small size, fast responding speed and stable emission wavelength, etc.

Generally speaking, the LED can be applied to the specific purposes of various home appliances and computer equipments, such as computer peripherals, clock displays or instrumental panels. However, with the enhancement of the LED in illumination, brightness and color rendition, the LED display is developed accordingly. The LED display can be used in indoors/outdoors full color bulletin boards, traffic lights, and variable message signs (VMS), etc.

In the conventional technologies, the LED display is composed of a LED array for displaying letters, digits or full color images. The structure of a conventional LED is as shown in FIG. 1. The LED shown in FIG. 1 comprises a coating resin 101, a LED chip 102, a conductive wire 103, a molding material 104, a lead frame 105 and an inner lead 106, wherein the lead frame 105 comprises a base 105a and a lead 105b. The description of the aforementioned LED structure can be referred to U.S. Pat. No. 5,998,925. Hereinafter, the LED structure will be described in details.

Such as shown in FIG. 1, the coating resin 101 is filled in the base 105a to cover the LED chip 102, so as to prevent the LED chip 102 from contacting oxygen or moisture, thereby protecting the LED chip 102. The coating resin 101 is generally made of transparent material, such as epoxy resin, urea resin or glass, etc. However, the thermal expansion coefficient and heat conductivity of the coating resin 101 are apparently different from those of the LED chip 102, so that the heat generated from the imperfect electro-optical conversion is easy to be accumulated on the interface between the coating resin 101 and the LED chip 102, while the optoelectronic element is in operation. Moreover, in the manufacturing process, it is quite important about how to use proper temperature and process for the coating resin 101 to be stably coated on or filled in the area surrounding the LED chip 102, and meanwhile, to assure that no extra chemical reaction between two different materials (the coating resin 101 and the LED chip 102) will occur. However, with the current technology, it usually needs to perform a baking step on the coating resin 101 at 150° C. for about 40 minutes, so as cure the coating resin 101. Hence, for fitting to the current process, the coating resin 101 of high purity has to be selected as the material used for coating or filling, (since some elements are easy to be diffused into semiconductor material to change the original properties of the semiconductor material).

The aforementioned structure also causes another bad influence. As the coating resin 101 is a poor heat conductor, heat is accumulated on the interface between two different materials (the coating resin 101 and the LED chip 102). Due to the difference in the thermal expansion coefficients between the coating resin 101 and the LED chip 102, while the element is in operation, heat accumulated therein causes additional stress exerted on the LED chip 102, wherein the stress is exactly proportional to the interface temperature (which is caused by the accumulated heat). While LED elements are developed towards the applications of high brightness and high power, the aforementioned problem will become more and more serious. Even on the current common applications, since the coating resin 101 and the LED chip 102 are different in material properties, the operation stability and life of the optoelectronic element are affected directly or indirectly.

Further, please refer to FIG. 2, which is a detailed diagram showing the elements around the base 105a, wherein the LED chip 102 is a semiconductor element having a PN junction 107. Hence, when a positive voltage is applied to two electrodes of the LED chip 102, the light of specific wavelength will be emitted from the PN junction 107 of the LED chip 102. In the aforementioned structure, the light emitted by the LED chip 102 towards the base 105a cannot be emitted again to the external, and thus the light emission intensity and efficiency of the entire LED device are affected. However, under the current structure, these shortcomings are inevitable.

Such as shown in FIG. 2, the coating resin 101 is used to fill in the base 105a to cover the LED chip 102, and the coating resin 101 may comprise fluorescent matter, such as phosphor. Besides, the coating resin 101 can be transparent material, such epoxy resin, urine resin or glass, etc. Moreover, the fluorescent matter contained in the coating resin 101 can change the light emission wavelength by the way of energy conversion, and the porosity and coating thickness of the fluorescent matter also affect the color of the colored light emitted after the wavelengths respectively generated by the LED and the fluorescent matter are mixed. However, on one hand, due to the oxidization reaction and the deterioration scheme of the coating resin 101 itself, and on the other hand, due to the temperature influence and the UV light irradiation, the deterioration of the coating resin 101 and phosphor is thus accelerated. When the coating resin 101 is deteriorated and cured because of heat, or is damaged by the UV light in sunshine, the coating resin 101 has the phenomenon of curing and deteriorating. Once the coating resin 101 starts deteriorating, the LED chip 102 covered thereby will be affected and damaged. Especially for the element of which the waveband of light emitted is below that of blue light (wherein the wavelength of emitted light is smaller than 480 nm), because the LED chip thereof has the attribute of spontaneous light-emission, and additionally, the light traveling path thereof is concentrated within a specific angle, resulting in high light emission intensity, consequently, the damage to the coating resin is more sever. With the occurrence of these situations, the LED device has the chance to be functionally retarded.

In U.S. Pat. No. 5,367,441, the frame is filled with scattering bodies, wherein the material of the scattering bodies is similar to that of the coating resin 101 shown in FIG. 2. Hence, the structure used in this conventional technology is the same as that described previously, thus also causing the damage to the LED chip and the conductive wire, resulting in reducing the light permissibility of the coating resin 101, so that the LED is functionally retarded.

Please refer FIG. 1 again. In the process for manufacturing the conventional LED, the LED chip 102 has to first be fixed on the base 105a. Thereafter, the conductive wire 103 is formed between the LED chip 102 and the inner lead 106 in a manner of wiring. Then, the coating resin 101 is filled in the base 105a to cover the LED chip 102 and part of the conductive wire 103. However, errors may occur in the process of fixing the LED chip 102, and the conductive wire 103 may not be able to be formed accurately on the bonding pad of the LED chip 102 while being formed on the LED chip 102, thus causing the LED chip 102 to be nonconductive, resulting in manufacturing a defective LED.

On the other hand, as to a photosensitive element, the photosensitive element can be a photodiode, a PIN diode, a photo crystal or a solar cell. Referring to FIG. 3, FIG. 3 is a schematic diagram showing a conventional photodiode of TO-CAN type. FIG. 3 illustrates a photodiode 110, a base 120, a lead pin 130, a lead pin 132, a metal cover 144, a light-emitting window 154, a conductive wire 180, a jointing solder pad 190 and an insulation part 195, etc., wherein the photodiode 110 is fixed on one surface of the base 120, and the lead pin 130 and the lead pin 132 are connected to the other surface of the base 120 for transmitting electrical signals.

As to the metal-can packaging of the photodiode 110, it means that the metal cover 144 is fitted to the base 120, so as to protect the photodiode 110. Besides, the light-emitting window 154 is inset into the upper surface of the metal cover 144, so that, when the metal cover 144 is fitted to the base 120, an incident light 200 from the external can pass through the light-emitting window 154 and is refracted to become an incident light 202, which is further focused on the photodiode 110. Further, when the metal cover 144 is fitted to the base 120, a space 174 is formed between the metal cover 144 and the base 120, wherein the photodiode 110 is located in the space 174. Moreover, one electrode of the LED 110 is electrically connected to the lead pin 130 via the conductive wire 180, and the other electrode of the photodiode 110 is electrically connected to the lead pin 132 via the base 120. Besides, the insulation material 195 is used to isolate the lead pin 130 from the base 120.

The photodiode 110 is a diode that is sharply sensitive to light. When the light irradiates the photodiode 110, the reverse-current of the photodiode 110 will be enlarged, particularly when the photodiode 110 is mostly operated under the condition of reverse bias, wherein it has to be noted that: since the photodiode 110 is a passive element, if the intensity of the incident light 202 emitted to the photodiode 110 is too low, the noise measured from the photodiode 110 will be very large i.e. the signal/noise ratio (S/N Ratio) will be extremely low. Hence, it is a quite important topic about how to design a better structure of packaging to the best possibility for promoting the operation efficiency of the photodiode 110 of photosensitive type, thereby achieving the purpose of photo-detection.

However, the aforementioned photosensitive element of TO-CAN type has the shortcomings described as follows. At first, the light-emitting widow allowing light to enter is not large on the front-side of the photosensitive element of TO-CAN type. Secondly, upon the front-side light being emitted to the surface of the photosensitive element of TO-CAN type, the light reflected thereby is very strong. Moreover, the total reflection will result in the loss of the incident light. Thus, the incident light intensity actually emitted to the photosensitive element becomes very small due to all kinds of loss. Further, because the light emitted to the photodiode is not focused, therefore, even if the light can smoothly pass through the light-emitting window of TO-CAN to the photodiode, the light still cannot be concentrated totally on the sensing area of the photodiode since the light is too divergent. Hence, if the signal intensity from the sample to be tested is very low, the photodiode will not be able to perform light detection normally, due to the insufficient intensity of incident light received by the photodiode (i.e. the S/N ratio is too low).

To resolve the problems of sever loss and over divergence for the incident light, the process or the structure of the photodiode can be modified. For example, in U.S. Pat. No. 6,278,145, it is stated that the semiconductor manufacturing process of the photodiode has to be modified, but it is not taught that, by means of new design, the optimized structure of the photosensitive element is used to promote the operation efficiency of the element.

To sum up, for the current development of optoelectronic devices, it is an important topic about, how to provide an optoelectronic device to efficiently direct the light emitted by the light-emitting element to the external of the device via the optimum design, thereby promoting the light emission efficiency of the optoelectronic device; or how to effectively concentrate the light emitted to the optoelectronic device on an optoelectronic element, thereby increasing the sensitivity thereof, also preventing the light-emitting element or photosensitive element from being damaged by the coating resin.

SUMMARY OF THE INVENTION

For overcoming the conventional problems described in the aforementioned background, one object of the present invention is to provide an optoelectronic device, so as to efficiently emitting light to the external from the optoelectronic device for increasing the light emission efficiency thereof, wherein the light is emitted from an optoelectronic element.

Another object of the present invention is to provide an optoelectronic device, so as to efficiently concentrate the light emitted to the optoelectronic device on a photosensitive element for increasing the sensitivity thereof (i.e. high S/N ratio).

Another object of the present invention is to provide an optoelectronic device, so as to prevent an optoelectronic element from being damaged by a coating resin. Meanwhile, since the filling material of resin currently used in packaging the element has poor resistance in general to the UV light or the light with short wavelength, it is very easy to result in the failure of the entire optoelectronic device due to the invalid filling material. Since the present invention does not need to use any filling material, but uses gas (such as inert gas) as the filling material in the device, therefore the aforementioned problems do not occur. With the application of the present invention, the optoelectronic device subsequently using the present invention for element packaging will make great improvement in the aspect of operation stability, operation life, or optoelectronic properties.

To achieve the aforementioned objects, the optoelectronic device of the present invention comprises a transparent conductive substrate, an optoelectronic element and a base. The optoelectronic element is disposed on the transparent conductive substrate, and the electrodes of the optoelectronic element are electrically connected to the transparent conductive substrate. An opening is formed on the base, and the bottom of the opening is a reflective surface, wherein the optoelectronic element is contained in the opening. When the optoelectronic element is contained in the opening, the optoelectronic element can be held in a manner of suspending from the reflective surface, or contact the reflective surface.

The present invention is characterized in having a transparent conductive substrate and a base that has an opening and a reflective surface, and can match up with the transparent conductive substrate. By disposing the optoelectronic element in the aforementioned opening, the light emitted from the optoelectronic element can be directly emitted upwards through the transparent substrate, or can be first emitted downwards through the reflective surface and then reflected by the transparent conductive substrate.

When the optoelectronic element is a LED, if the transparent conductive substrate uses the material that is transparent under the light emission waveband, then the light can be directly emitted upwards from the LED, or also can be first emitted downwards and then reflected by the reflective surface, or can be emitted upwards and downwards simultaneously and then reach the outside of the conductive substrate via the reflective surface. When the optoelectronic element is a photosensitive element, it can receive the light emitted directly thereto or the light reflected by the reflective surface.

Further, the optoelectronic device of the present invention comprises a conductive wire, wherein one end of the conductive wire is electrically connected to one electrode of the optoelectronic element, and the other end of the conductive wire is electrically connected to the transparent conductive substrate.

Moreover, the transparent conductive substrate in the optoelectronic device of the present invention comprises transparent plate, a transparent electrode film, an insulation part and a jointing solder pad. The transparent electrode film and the insulation part are formed on the transparent plate, and the insulation part divides the transparent electrode film into a first transparent electrode film area and a second transparent electrode film area that are not mutually conducted to each other, wherein the first transparent electrode film area is electrically connected to an electrode of the optoelectronic element, and the jointing solder pad is formed on a second transparent electrode film.

Just as described above, the reflective surface in the base further comprises a florescent, wherein the florescent layer can change the wavelength of the light emitted to the reflective surface, whereby the optoelectronic device can emit the light of the required color. Further, the base further comprises a first electrode part and a second electrode part, wherein the first and second electrode parts are electrically connected to the first transparent electrode film area and the second transparent electrode film area respectively.

Since the optoelectronic device of the present invention can use the reflective surface to reflect out the light emitted downwards by the LED, thereby increasing the light emission efficiency of the LED, or can reflect the light received intensively to the photosensitive element, thus increasing the sensitivity of light detection. Moreover, in the optoelectronic device of the present invention, the optoelectronic element is disposed in a space between the transparent conductive substrate and the bottom of the base, and the space does not need to be filled with any coating resin, thus preventing the optoelectronic element from being damaged by the coating resin.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Hereinafter, an optoelectronic device is explained by referring to the related figures, according to preferred embodiments of the present invention, wherein same reference numbers are used for the same elements for explanation.

According to a preferred embodiment of the present invention, an optoelectronic device comprises an optoelectronic element, a transparent conductive substrate and a base. The optoelectronic element can be an optically-active element, such as a light-emitting element, or an optically-passive element, such as a photosensitive element or a solar cell. Hereinafter, the light-emitting element in the optically-active elements will be first used as an example to explain a preferred embodiment of the present invention.

Figure 4:
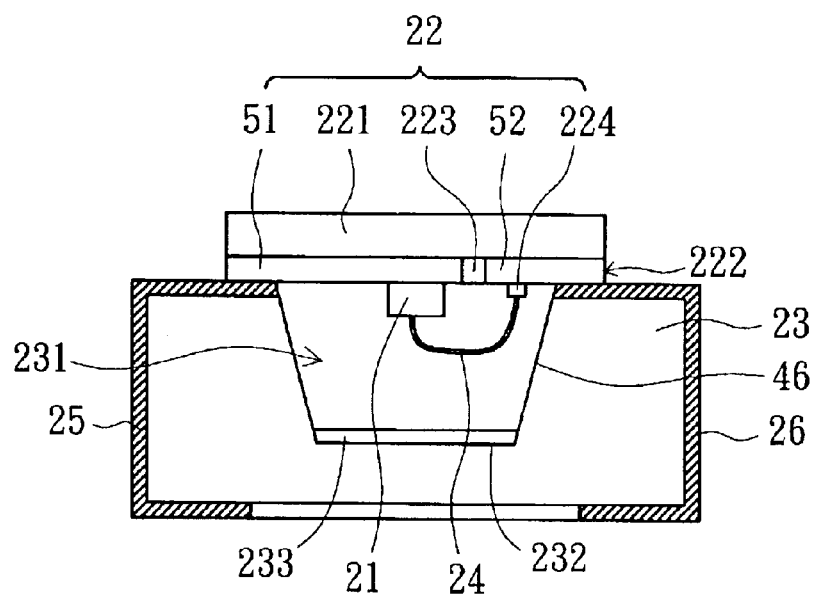
FIG. 4 is a schematic diagram showing an optoelectronic device, according to a preferred embodiment of the present invention, wherein the optoelectronic element is held in a manner of suspending from the bottom of the opening.

Referring to FIG. 4, the optoelectronic device shown in FIG. 4 comprises an optoelectronic element 21, a transparent conductive substrate 22, a base 23 and a conductive wire 24.

In this embodiment, the transparent conductive substrate 22 is mainly composed of a transparent plate 221 and a transparent electrode film 222, wherein the transparent electrode film 222 is divided by an insulation part 223 into a first transparent electrode film area 51 and a second transparent electrode film area 52, and a jointing solder pad 224 is formed on the second transparent electrode film area 52. The optoelectronic element 21 is fixed on the transparent conductive substrate 22 with an electrically-conductive glue, and one electrode of the optoelectronic element 21 is electrically connected to the transparent conductive substrate 22 via an electrically-conductive glue, and the other electrode of the optoelectronic element 21 is electrically connected to the transparent conductive substrate 22 via a conductive wire 24. An opening 231 is formed on the base 23, and the bottom of the opening 231 is a reflective surface 232, wherein the optoelectronic element 21 is contained in the opening 231, and is held in a manner of suspending from the bottom of the opening 231. It has to be noted that the optoelectronic element 21 can be any light-emitting semiconductor element, such as a LED, an organic light-emitting diode (OLED) or a laser diode, etc.

Continuously from the above, in the transparent conductive substrate 22, the first transparent electrode film area 51, the second transparent electrode film area 52 and the insulation part 22 are formed on the transparent plate 221, and the insulation part 223 is disposed between the first transparent electrode film area 51 and the second transparent electrode film area 52 to isolate the first transparent electrode film area 51 from the second transparent electrode film area 52. As to the transparent plate 221, it is a substrate made of light-permissible material, such as an $Al_2O_3$ substrate, a ceramic substrate, an amorphous substrate, or a polymer substrate, wherein the $Al_2O_3$ substrate can be such as a sapphire substrate; the amorphous substrate can be made of such as glass; and the polymer substrate can be such as an acrylic plate. Besides, the optoelectronic element 21 is fixed on the first transparent electrode film area 51 with an electrically-conductive glue, and one electrode of the optoelectronic element 21 is electrically connected to the first transparent electrode film area 51 via an electrically-conductive glue. The jointing solder pad 224 is disposed on the second transparent film area 52, and the conductive 224 is electrically conducted to the other electrode of the optoelectronic element 21, wherein the first electrode film area 51 and the second electrode film area 52 can be formed by using transparent electrode film material, such as the pattern of one or multiple layers selected from a group consisting of ITO, ZnO, CTO, IZO, $ZrO_2$, AZO. Further, a plurality of layers, selected arbitrarily from nickel, silver, aluminum, titanium, chromium, gold, platinum, tungsten, tungsten silicide, zinc, indium and aluminum-silicon alloys, can also be used for forming the first transparent electrode film area 51 and the second transparent electrode film area 52. It has to be noted that the transparent conductive substrate 22 (including the first transparent electrode film area 51 and the second transparent electrode film area 52) can be made of any material that is transparent under the light emission waveband, and should not be limited to the examples described above.

Moreover, a reflective surface 232 of the base 23 can reflect the light emitted from the optoelectronic element 21. When the base 23 sustains the transparent conductive substrate 22, the optoelectronic element 21 is located in the opening 231 and between the transparent conductive substrate 22 and the base 23 without contacting the reflective surface 232. The reflective surface 232 further comprises a florescent layer 233 formed thereon, wherein the florescent layer 233 can change the wavelength of the light emitted from the reflective surface 232, thereby changing the color of the light emitted from the optoelectronic device of this embodiment. The material of the base 23 can be ceramic material or semiconductor material, and the florescent layer 233 contains florescent material, such as phosphor, and the porosity and thickness of the florescent material in the florescent layer 233 can affect the color of the light emitted from the optoelectronic element 21, such as white light, pink light, red light, blue light or violet light, etc.

In this embodiment, a first electrode part 25 and a second electrode part 26 can be formed on two sides of the base 23, and these two electrode parts can be surface mounted devices (SMD) formed by using surface mounted technology (SMT). Hence, when the transparent conductive substrate 22 is disposed on the base 23, the first transparent electrode film area 51 contacts the first electrode part 25, and the second transparent electrode film area 52 contacts the second electrode part 26, and the first electrode part 25 is further electrically connected a negative electrode (not shown) in the external, and the second electrode part 26 is further electrically connected a positive electrode (not shown) in the external. Therefore, when the first electrode part 25 and the second electrode part 26 is respectively charged with positive and negative voltages, the first transparent electrode film area 51 and the second transparent electrode film area 52 can be electrically conducted simultaneously. Also, when the optoelectronic element 21 is a light-emitting element, those two electrodes of the optoelectronic element 21 are charged to emit light. Those who are skilled in the art should be able to understand that the optoelectronic element 21 can be normally operated under the condition of forward bias (such as an active-typed optoelectronic element) or reverse bias (such as a passive-typed optoelectronic element) according to the operation characteristic of the optoelectronic element 21.

It has to be noted that, besides a first electrode part 25 and a second electrode part 26 having the form of SMD, the optoelectronic device of the present invention can also be a LED lamp, a LED backlight, a LED high power package or a LED cell (COB LED), etc.

Besides, according an optoelectronic device of a preferred embodiment of the present invention, a space of the opening 231 in the base 23 can be filled with gas, such as air or helium, or can be at vacuum stat. When the space in the opening 231 is filled with gas, the damage caused by the coating resin 101 can be avoided. Moreover, a light-reflective layer 46 is coated on the inner wall of the opening 41 to reflect light. Further, the inner wall of the opening 231 can be orthogonal to the bottom thereof (not shown), or not orthogonal (such as shown in FIG. 4) thereto. In other words, without violating the scope of the inventive spirit of the present invention, those who are skilled in the art should be able to design the opening 231 of different shapes.

Figure 5:
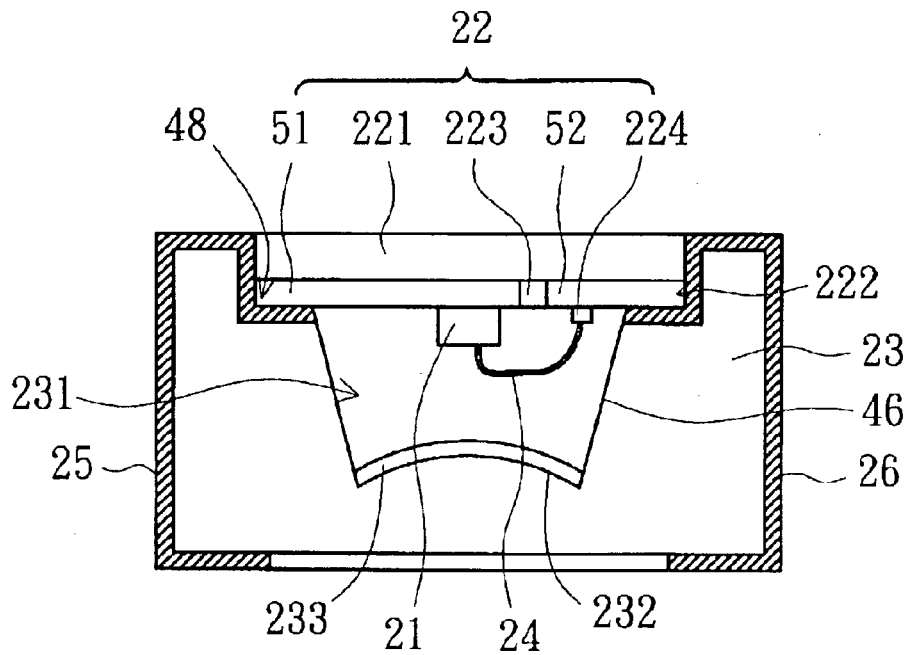
FIG. 5 is a schematic diagram showing an optoelectronic device, according to another preferred embodiment of the present invention, wherein the cross-section of the base is a stair shape, and the reflective surface is a convex curved surface, and the optoelectronic element is held in a manner of suspending from the bottom of the opening.
Figure 6:
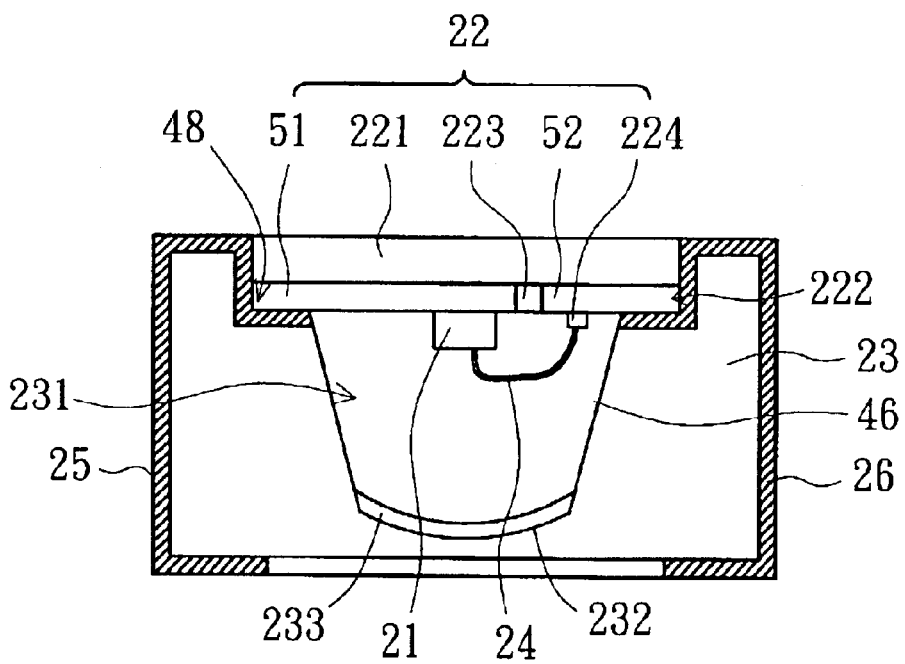
FIG. 6 is a schematic diagram showing an optoelectronic device, according to another preferred embodiment of the present invention, wherein the cross-section of the base is a stair shape, and the reflective surface is a concave curved surface, and the optoelectronic element is held in a manner of suspending from the bottom of the opening.

Please refer to two embodiments shown in FIG. 5 and FIG. 6. In FIG. 5 and FIG. 6, in the opening 231, between the open end and the reflective surface 232, the shape of the cross-section of the base 23 can be an inner wall 48 of stair shape. Hence, when the transparent conductive substrate 22 is disposed in the opening 231 of the base 23, it has the effect of self-aligning for conveniently implementing the transparent conductive substrate 22. Further, the reflective surface 232 can be a convex curved surface of which the central portion is bulgy (FIG. 5), or a concave curved surface of which the central portion is recessed. When the reflective surface 232 is the convex curved surface of which the central portion is bulgy, the emission angle of the reflected light can be increased, thus increasing the range of the light emitted from the optoelectronic device. When the reflective surface 232 is the concave curved surface of which the central portion is recessed, the angle of the reflected light can be concentrated, thus increasing the illumination range of the light emitted from the optoelectronic device.

Figure 7:
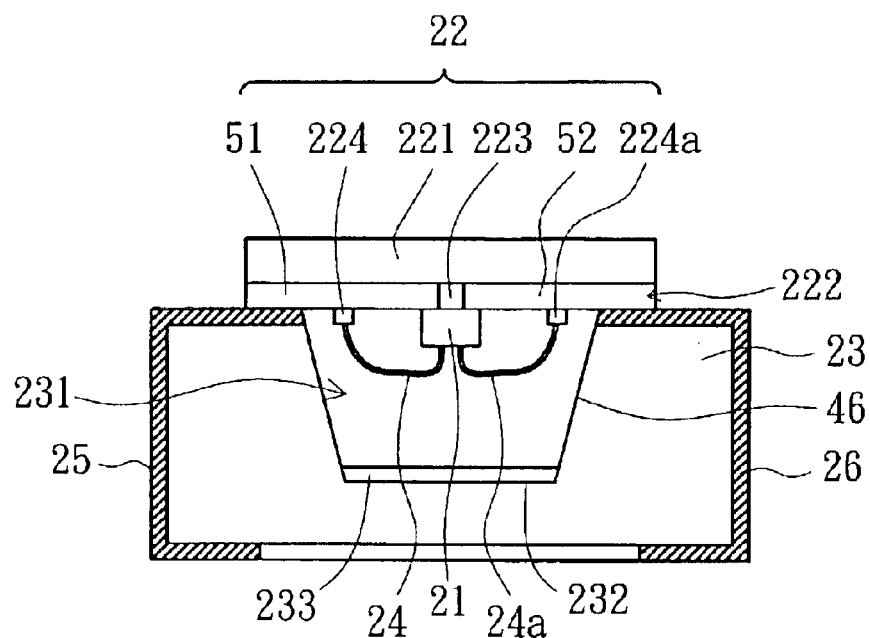
FIG. 7 is a schematic diagram showing an optoelectronic device, according to another preferred embodiment of the present invention, wherein two conductive wires are used to be electrically connected to the first transparent electrode film area and the second transparent electrode film area, and the optoelectronic element is held in a manner of suspending from the bottom of the opening.
Figure 8:
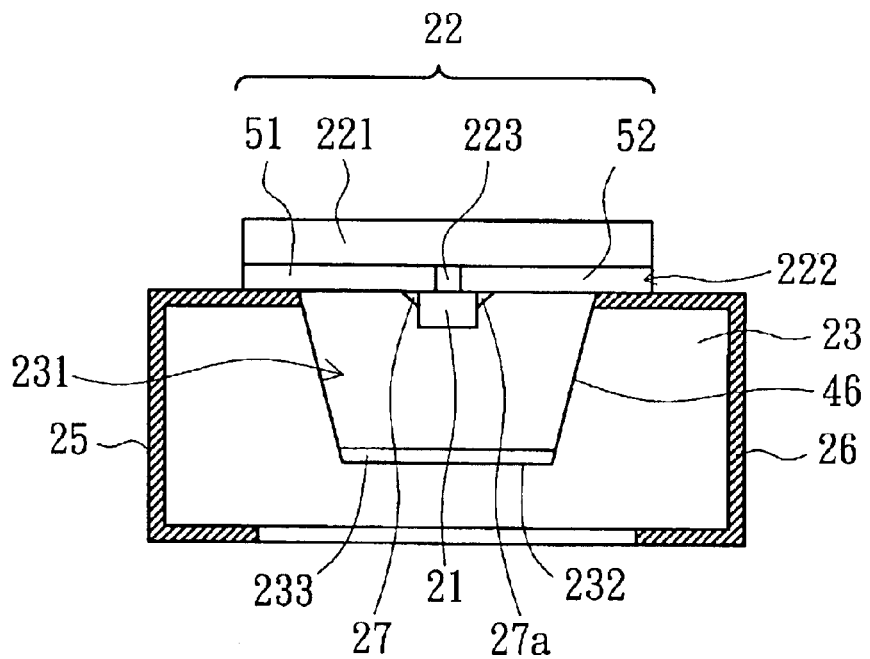
FIG. 8 is a schematic diagram showing an optoelectronic device, according to another preferred embodiment of the present invention, wherein two electrically-conductive glues are used to be electrically connected to the first transparent electrode film area and the second transparent electrode film area, and the optoelectronic element is held in a manner of suspending from the bottom of the opening.

Please refer to another preferred embodiment shown in FIG. 7. The optoelectronic element 21 can be fixed on the insulation part 223 of the transparent conductive substrate 22 with electrically nonconductive glue. One electrode of the optoelectronic element 21 is electrically connected to the first transparent electrode film area 51 of the transparent conductive substrate 22 via the conductive wire 24 and the jointing solder pad 224a. Please refer to another preferred embodiment shown in FIG. 8. The optoelectronic element 21 can be fixed on the insulation part 223 of the transparent conductive substrate 22 with electrically non-conductive glue, and can be electrically connected to the first transparent electrode film areas 51 and 52 respectively by using the electrically conductive glues 27 and 27a.

It has to be noted that those who are skilled in the art can modify the shape of the opening 231 and that of the reflective surface 232 according to the characteristics of the optoelectronic element 21, and can design the florescent layer 233 with the florescent material of different thickness or concentration. Hence, the optoelectronic element 21 can be disposed on an arbitrary location in the space between the base 23 and the transparent conductive substrate 22. As long as the shape of the inner wall and that of the reflective surface 232 are modified accordingly, the light emitted from the optoelectronic element 21 can all be reflected to the external via the transparent conductive substrate 22.

Figure 9:
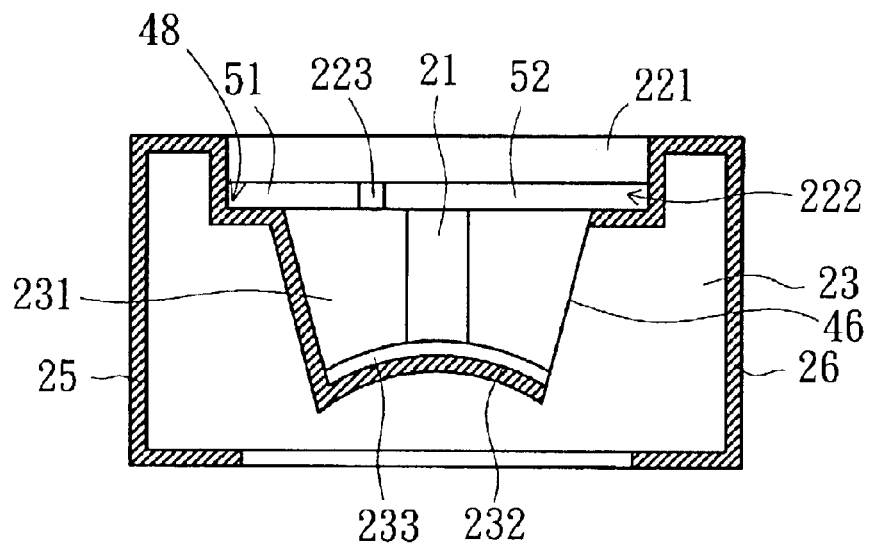
FIG. 9 is a schematic diagram showing an optoelectronic device, according to another preferred embodiment of the present invention, wherein the optoelectronic element contacts the bottom of the opening.

Continuously from the above, in all the aforementioned embodiments, the optoelectronic element 21 can also contact the bottom of the opening 231, such as shown in FIG. 9. In FIG. 9, the optoelectronic element 21 contacts the reflective surface 232 and florescent layer that are the convex curved surfaces at the bottom of the opening 231. The first electrode part 25 extends inwards to the area below the reflective surface 232, so that the lower surface of the optoelectronic element 21 is electrically connected to the first electrode part 25, and the upper surface of the optoelectronic element 21 is electrically connected to the second electrode part 26 via the second transparent electrode film area 52. Since the insulation part 223 isolated the first transparent electrode film area 51 from the second transparent electrode film area 52, the optoelectronic element 21 can be electrically conducted to emit light with short circuiting. Those who are skilled in the art should be able to understand that the structure, in which the optoelectronic element 21 contacts the bottom of the opening 231, can be easily applied to all the aforementioned embodiments.

Figure 1:
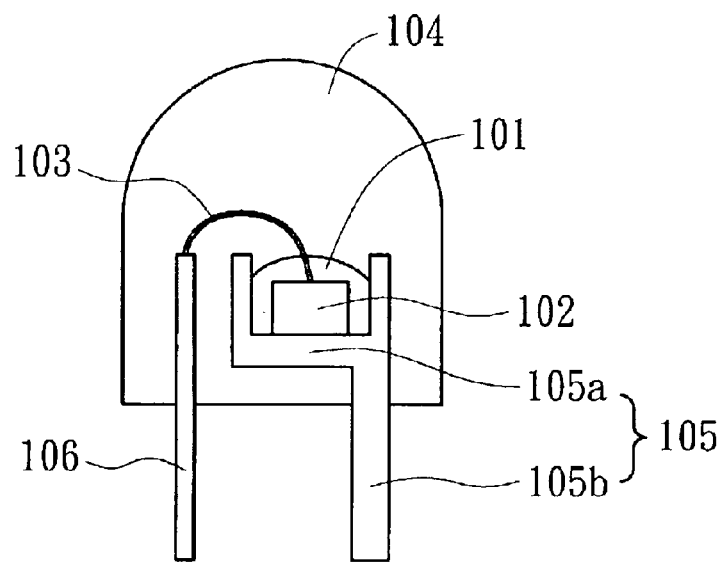
FIG. 1 illustrates the structure of a conventional LED.
Figure 2:
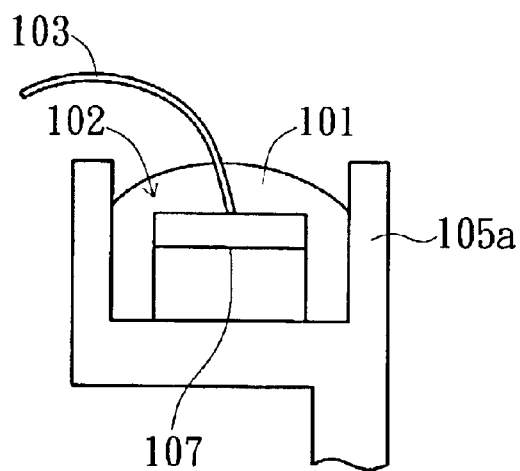
FIG. 2 is a detailed diagram showing the base portion of the conventional LED.
Figure 3:
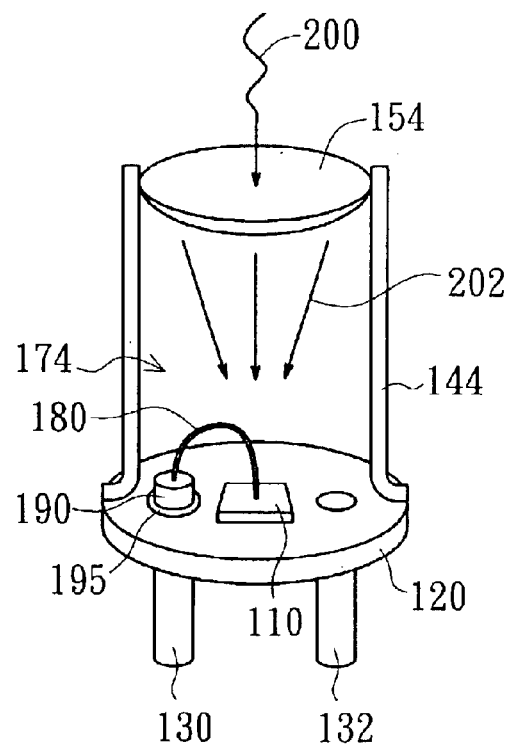
FIG. 3 is a schematic diagram showing a conventional LED of TO-CAN type.

Further, in another preferred embodiment of the present invention, the optoelectronic element 21 can be a photosensitive element of the passive elements, such as a photodiode. Please refer to the one shown in FIG. 4 to FIG. 8. The optoelectronic element 21 shown in FIG. 4 to FIG. 8 can be substituted by a photosensitive element. Take FIG. 6 as an example. Since the reflective surface 232 is a concave curved surface of which the central portion is recessed, the light emitted to the optoelectronic device of this embodiment can be reflected, and be intensively emitted to the optoelectronic element 21, thereby increasing the light intensity received by the optoelectronic element 21. In other words, the conventional technology shown in FIG. 3, if the light emitted to the optoelectronic element 110 is very weak, the optoelectronic element 110 can be effectively actuated. However, when the same weak light is emitted to the optoelectronic element shown in FIG. 6, the optoelectronic element 21 still can be actuated.

To sum up, the optoelectronic element of the present invention can use the reflective surface 232 to reflect the light emitted downwards from the optoelectronic element, thereby enhancing the light emission efficiency of the optoelectronic element, or to reflect the light emitted to the optoelectronic element intensively to the optoelectronic element 21, thereby increasing the sensitivity of the optoelectronic element. Further, since the optoelectronic element 21 is disposed between the transparent conductive substrate 22 and the bottom of the base 23, the space therein can be filled with gas to prevent the optoelectronic element 21 from being damaged by the coating resin. Moreover, the present invention uses the transparent conductive substrate 22 that is turned upside down and disposed in the opening 231 of the base 23.

Since the cross-section of the base 23 can be the shape of stair, it convenient to dispose the transparent conductive substrate 22 on the base 23, thereby benefiting the manufacture of the optoelectronic device and reducing the defects thereof.

Besides, the space in the opening 231 can further be filled with any electrically non-conductive liquid that can assist the heat dissipation. Particularly, when the space in the opening 231 is filled with the heat-dissipating material such as electrically non-conductive liquid, the naturally cooling effect will be achieved due to heat convection. When the space in the opening 231 is filled with liquid, the liquid can be the material having proper refraction index, and additionally, the technology of refractory index matching can be used to increase the light emission efficiency. For example, the combination of liquid $TiO_2$ of which the refraction index is about 2.0 and deionized water (DI Water) of which the refraction index is about 1.5, will have better effect than epoxy resin of which the refraction index is about 1.4, the former also can enhance the heat-dissipation effect. Or, the DI water can also be wrapped in soft gel to form a sealed space filled in the space of the opening 231, thereby attaining the purpose of dissipating heat and increase the effect of light emission. This advantage combining with the disclosed full-color display device that can adjust the light emitting angle arbitrarily, will make the optoelectronic device of the present invention become highly suitable for use in packaging high power elements, i.e. this packaging method also can be applied to high power photodiodes, laser and high power photodiodes, and solar cells, etc.

Figure 10:
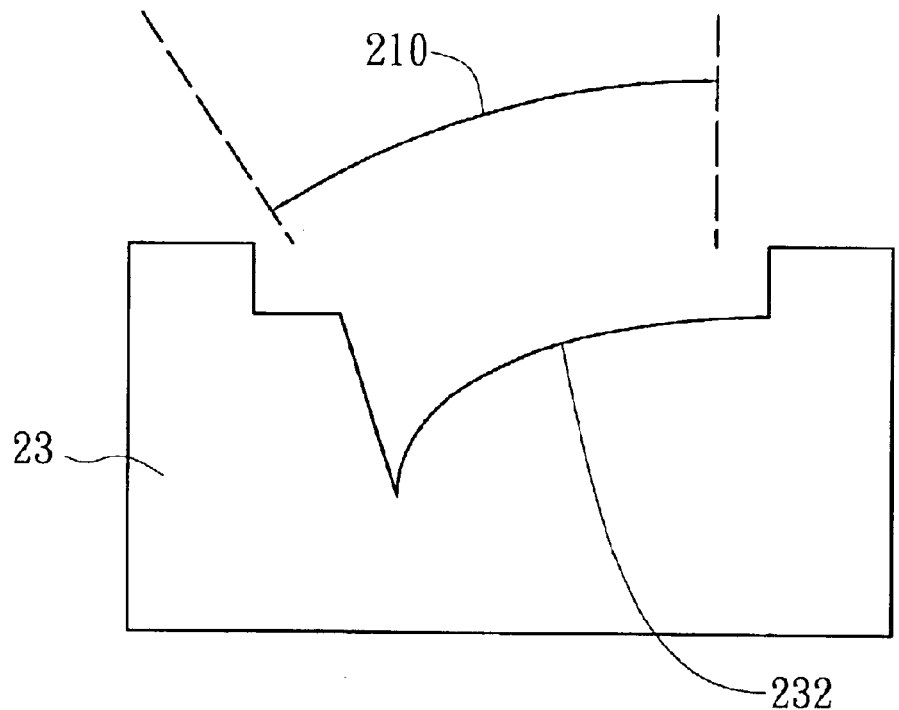
FIG. 10 is a schematic diagram showing a base of an optoelectronic device, according to another preferred embodiment of the present invention, wherein the reflective surface is a semiconvex curved surface.
Figure 11:
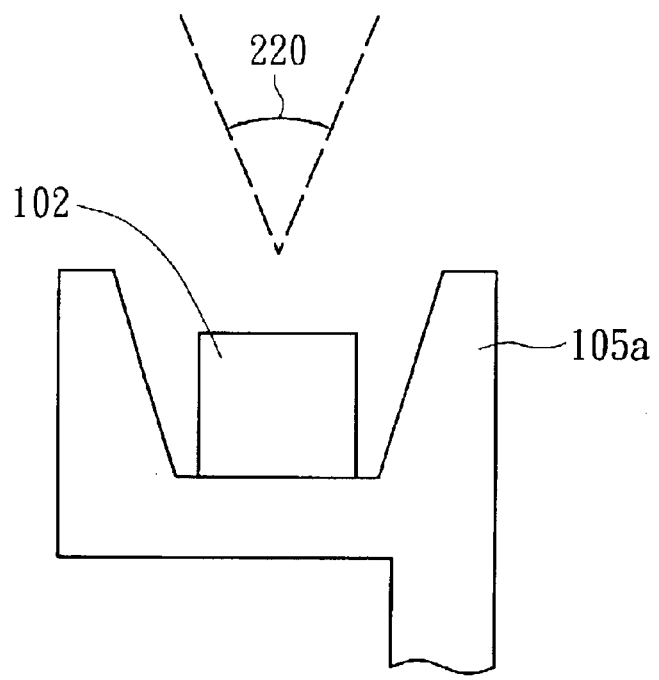
FIG. 11 is a schematic diagram showing the base portion of the conventional LED, wherein the possible range of the emitting angle is further illustrated.

Moreover, the base 23 of the present invention can also be designed as the reflective surface 232 shown in FIG. 10, wherein light from different directions can reflected by the reflective surface 232 to be the reflected light having a half angle 210, i.e. the incident light from all different directions can be totally controlled in the direction towards the left. Hence, the design of the base 23 using this principle can easily reflect the light arbitrarily to the left; to the right; to the top; or to the bottom without sacrificing any light force. Further, such as the conventional method shown in FIG. 11, the emitting angle is a full angle 220. Hence, it is very difficult to control the light merely inclining to the left hemisphere; to the right hemisphere; to the upper hemisphere; or to the lower hemisphere by using the conventional method.

Figure 12:
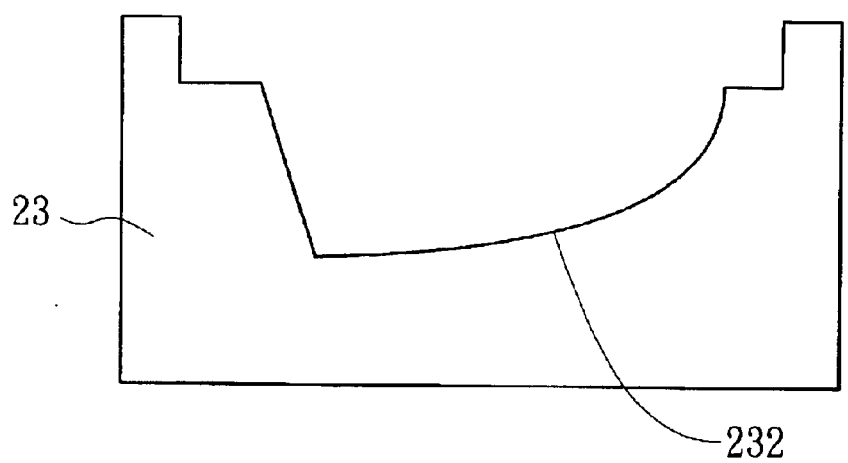
FIG. 12 is a schematic diagram showing a base of an optoelectronic device having a photosensitive element, according to another preferred embodiment of the present invention, wherein the reflective surface is a semiconcave curved surface.

Further, if it is necessary for the photodiode, the base 23 having the reflective surface 232 with a semiconcave curved surface can also be designed, wherein the base 23 can receive light with half angle, i.e. if it is known that some light is only emitted within a specific direction, then the optoelectronic device with this design can receive or stimulate signals in accordance with a certain direction. Consequently, comparing to the conventional design that needs to use the angle twice as much as the present invention, the structure of the base 23 of the present invention shown in FIG. 12 can effectively improve the S/N ratio, and can accurately control the light entering the base 23 for assuring that only the light from specific directions is allowed to enter the optoelectronic element.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structures.

What is claimed is:

1. An optoelectronic device, comprising:
    a transparent conductive substrate;
    an optoelectronic element, disposed on said transparent conductive substrate and is electrically connected to said transparent conductive substrate; and
    a base having an opening, wherein a bottom of said opening is a reflective surface, and said optoelectronic element is contained in said opening, and said reflective surface is selected from a group consisting of a convex curved surface and a concave curved surface.

2. The optoelectronic device of claim 1, wherein said optoelectronic element is a light-emitting element, and the light emitted from said optoelectronic element is reflected out via said reflective surface.

3. The optoelectronic device of claim 1, wherein said optoelectronic element is a light-emitting element, and the light emitted from said optoelectronic element is reflected out through said transparent conductive substrate.

4. The optoelectronic device of claim 1, wherein said optoelectronic element is a light-emitting element, and one portion of the light emitted from said optoelectronic element is reflected out through said transparent conductive substrate, and the other portion of the light emitted from said optoelectronic element is reflected out by said reflective surface.

5. The optoelectronic device of claim 1, wherein said optoelectronic element is a photosensitive element, and said optoelectronic element receives the light reflected from said reflective surface.

6. The optoelectronic device of claim 1, wherein said optoelectronic element is a photosensitive element, and said optoelectronic element receives the light emitted through said transparent conductive substrate.

7. The optoelectronic device of claim 1, wherein said optoelectronic element is a photosensitive element, and said optoelectronic element receives the light emitted through said transparent conductive substrate, and the light reflected from said reflective surface.

8. The optoelectronic device of claim 1, wherein an inner wall of said opening has a light-reflective layer formed on.

9. The optoelectronic device of claim 1, further comprising a fluorescent layer that is formed on said reflective surface for changing a wavelength of a light emitted to said reflective surface.

10. The optoelectronic device of claim 1, wherein the material forming said base is selected from a group consisting of ceramic material and semiconductor material.

11. The optoelectronic device of claim 1, further comprising a material filled in said opening, wherein said material is selected from a group consisting of gas and electrically non-conductive liquid.

12. The optoelectronic device of claim 1, wherein said optoelectronic device is selected from a LED (Light-Emitting Diode) lamp, a LED backlight, a LED high power package and a LED cell (COB LED).

13. The optoelectronic device of claim 1, wherein a first electrode part and a second electrode part are respectively formed on two sides of said base, and said first electrode part and said second electrode part are electrically connected to said transparent conductive substrate respectively.

14. The optoelectronic device of claim 13, wherein said first electrode part and said second electrode part are surface mounted devices (SMD).

15. The optoelectronic device of claim 13, wherein said optoelectronic element is held in a manner of suspending from said bottom of said opening.

16. The optoelectronic device of claim 13, wherein said optoelectronic element contacts said bottom of said opening.

17. The optoelectronic device of claim 16, wherein said optoelectronic element is electrically connected to said first electrode part.

18. The optoelectronic device of claim 16, wherein said optoelectronic element is electrically connected to said second electrode part.

19. The optoelectronic device of claim 1, wherein said transparent conductive substrate comprises:
    a transparent plate;
    a transparent electrode film, formed on said transparent plate; and
    an insulation part, formed on said transparent plate, wherein said insulation part divides said transparent electrode film into a first transparent electrode film area and a second transparent electrode film area that are not mutually conducted to each other.

20. The optoelectronic device of claim 19, further comprising:
    a jointing solder pad, formed on said second transparent electrode film area; and
    a conductive wire, wherein said optoelectronic element is electrically connected to said transparent conductive substrate via said conductive wire and said jointing solder pad.

21. The optoelectronic device of claim 19, further comprising:
    two jointing solder pads, wherein each of said jointing solder pads is formed on said first transparent electrode film and said second transparent electrode film area respectively; and
    two conductive wires, wherein said optoelectronic element is electrically connected to said transparent conductive substrate respectively via each of said conductive wires and each of said jointing solder pads.

22. The optoelectronic device of claim 19, wherein said optoelectronic element is electrically connected to said first transparent electrode film area and said second transparent electrode film area respectively via two electrically-conductive glues.

23. The optoelectronic device of claim 19, wherein the material forming said transparent electrode film is ITO.

24. The optoelectronic device of claim 19, wherein the material forming said transparent conductive film is selected from a group consisting of ITO, ZnO, CTO, IZO, $ZrO_2$ and AZO.

25. The optoelectronic device of claim 19, wherein the material forming said transparent electrode film is selected from a group consisting of nickel, silver, aluminum, titanium, chromium, gold, platinum, tungsten, tungsten silicide, zinc, indium and aluminum-silicon alloys.

26. The optoelectronic device of claim 19, wherein the material forming said transparent electrode film is selected from a group consisting of ITO, ZnO, CTO, IZO, $ZrO_2$, AZO, nickel, silver, aluminum, titanium, chromium, gold, platinum, tungsten, tungsten silicide, zinc, indium and aluminum-silicon alloys.

27. An optoelectronic device, comprising:
a transparent conductive substrate;
an optoelectronic element, disposed on said transparent conductive substrate and is electrically connected to said transparent conductive substrate;
a base having an opening, wherein a bottom of said opening is a reflective surface, and said optoelectronic element is contained in said opening; and
a first electrode part and a second electrode part, formed respectively on two sides of said base, wherein said first electrode part and said second electrode part are electrically connected to said transparent substrate respectively.

28. The optoelectronic device of claim 27, wherein said optoelectronic element is a light-emitting element, and the light emitted from said optoelectronic element is reflected out via said reflective surface.

29. The optoelectronic device of claim 27, wherein said optoelectronic element is a light-emitting element, and the light emitted from said optoelectronic element is reflected out through said transparent conductive substrate.

30. The optoelectronic device of claim 27, wherein said optoelectronic element is a light-emitting element, and one portion of the light emitted from said optoelectronic element is reflected out through said transparent conductive substrate, and the other portion of the light emitted from said optoelectronic element is reflected out by said reflective surface.

31. The optoelectronic device of claim 27, wherein said optoelectronic element is a photosensitive element, and said optoelectronic element receives the light reflected from said reflective surface.

32. The optoelectronic device of claim 27, wherein said optoelectronic element is a photosensitive element, and said optoelectronic element receives the light emitted through said transparent conductive substrate.

33. The optoelectronic device of claim 27, wherein said optoelectronic element is a photosensitive element, and said optoelectronic element receives the light emitted through said transparent conductive substrate, and the light reflected from said reflective surface.

34. The optoelectronic device of claim 27, wherein an inner wall of said opening has a light-reflective layer formed on.

35. The optoelectronic device of claim 27, wherein said reflective surface is selected from a group consisting of a convex curved surface and a concave curved surface.

36. The optoelectronic device of claim 27, further comprising a fluorescent layer that is formed on said reflective surface for changing a wavelength of a light emitted to said reflective surface.

37. The optoelectronic device of claim 27, wherein the material forming said base is selected from a group consisting of ceramic material and semiconductor material.

38. The optoelectronic device of claim 27, wherein said first electrode part and said second electrode part are surface mounted devices.

39. The optoelectronic device of claim 27, wherein said optoelectronic element is held in a manner of suspending from said bottom of said opening.

40. The optoelectronic device of claim 27, wherein said optoelectronic element contacts said bottom of said opening.

41. The optoelectronic device of claim 27, further comprising a material filled in said opening, wherein said material is selected from a group consisting of gas and electrically non-conductive liquid.

42. The optoelectronic device of claim 40, wherein said optoelectronic element is electrically connected to said first electrode part.

43. The optoelectronic device of claim 40, wherein said optoelectronic element is electrically connected to said second electrode part.

44. The optoelectronic device of claim 27, wherein said transparent conductive substrate comprises:
a transparent plate;
a transparent electrode film, formed on said transparent plate; and an insulation part, formed on said transparent plate, wherein said insulation part divides said transparent electrode film into a first transparent electrode film area and a second transparent electrode film area that are not mutually conducted to each other.

45. The optoelectronic device of claim 44, further comprising:
a jointing solder pad, formed on said second transparent electrode film area; and
a conductive wire, wherein said optoelectronic element is electrically connected to said transparent conductive substrate via said conductive wire and said jointing solder pad.

46. The optoelectronic device of claim 44, further comprising:
two jointing solder pads, wherein each of said jointing solder pads is formed on said first transparent electrode film and said second transparent electrode film area respectively; and
two conductive wires, wherein said optoelectronic element is electrically connected to said transparent conductive substrate respectively via each of said conductive wires and each of said jointing solder pads.

47. The optoelectronic device of claim 44, wherein said optoelectronic element is electrically connected to said first transparent electrode film area and said second transparent electrode film area respectively via two electrically-conductive glues.

48. The optoelectronic device of claim 44, wherein the material forming said transparent electrode film is ITO.

49. The optoelectronic device of claim 44, wherein the material forming said transparent conductive film is selected from a group consisting of ITO, ZnO, CTO, IZO, $ZrO_2$ and AZO.

50. The optoelectronic device of claim 44, wherein the material forming said transparent electrode film is selected from a group consisting of nickel, silver, aluminum, titanium, chromium, gold, platinum, tungsten, tungsten silicide, zinc, indium and aluminum-silicon alloys.

51. The optoelectronic device of claim 44, wherein the material forming said transparent electrode film is selected from a group consisting of ITO, ZnO, CTO, IZO, $ZrO_2$, AZO, nickel, silver, aluminum, titanium, chromium, gold, platinum,

* * * * *